(12) United States Patent
Nguyen et al.

(10) Patent No.: US 9,614,548 B1
(45) Date of Patent: Apr. 4, 2017

(54) SYSTEMS AND METHODS FOR HYBRID MESSAGE PASSING AND BIT FLIPPING DECODING OF LDPC CODES

(71) Applicant: Marvell International Ltd., Hamilton (BM)

(72) Inventors: Dung Viet Nguyen, San Jose, CA (US); Shashi Kiran Chilappagari, San Jose, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 146 days.

(21) Appl. No.: 14/326,095

(22) Filed: Jul. 8, 2014

Related U.S. Application Data

(60) Provisional application No. 61/843,739, filed on Jul. 8, 2013.

(51) Int. Cl.
*H04L 1/00* (2006.01)
*H03M 13/11* (2006.01)

(52) U.S. Cl.
CPC .............................. *H03M 13/1108* (2013.01)

(58) Field of Classification Search
CPC ...................................................... H04L 1/0009
USPC ......................... 714/774, 763, 752, 794, 758
See application file for complete search history.

(56) References Cited

U.S. PATENT DOCUMENTS

| | | | | |
|---|---|---|---|---|
| 7,793,201 B1* | 9/2010 | Ulriksson | ........... | H03M 13/015 714/752 |
| 8,312,354 B1* | 11/2012 | Varnica | ............. | H03M 13/1105 714/780 |
| 9,048,870 B2* | 6/2015 | Li | ..................... | H03M 13/6591 |
| 2008/0276156 A1* | 11/2008 | Gunnam | ........... | H03M 13/1177 714/801 |
| 2008/0292025 A1* | 11/2008 | Efimov | .................. | G11C 11/56 375/340 |
| 2013/0007551 A1* | 1/2013 | Krishnan | .......... | H03M 13/6577 714/752 |
| 2013/0019141 A1* | 1/2013 | Wang | ................. | H03M 13/1117 714/763 |
| 2013/0275827 A1* | 10/2013 | Wang | .................. | G06F 11/1076 714/752 |

* cited by examiner

*Primary Examiner* — Fritz Alphonse (57) ABSTRACT

Systems and methods are provided for iterative data decoding. Decoding circuitry receives a first message from a variable node at a check node. Decoding circuitry generates a second message based at least in part on the first message. Decoding circuitry transmits the second message to the variable node. Decoding circuitry updates a hard decision value of the variable node based at least in part on the first message and the second message.

16 Claims, 8 Drawing Sheets

602 RETRIEVE A SECOND PLURALITY OF MESSAGES
$\mathbf{m}_2 = [m(k-1, v_i, c_1), m(k-1, v_i, c_2), \ldots, m(k-1, v_i, c_{nc})]$
FROM MEMORY 604 COMPUTE A METRIC $S^k(v_i, c_j)$ BASED ON
$\mathbf{m}_2$ AND A THIRD PLURALITY OF MESSAGES
$\mathbf{m}_3 = [m(k, c_1, v_i), m(k, c_2, v_i), \ldots, m(k, c_{nc}, v_i)]$ 606 GENERATE A SECOND MESSAGE $m(k, v_i, c_j)$
BASED ON $h(0, v_i)$, $h(k, v_i)$ AND $S^k(v_i, c_j)$

SYSTEMS AND METHODS FOR HYBRID MESSAGE PASSING AND BIT FLIPPING DECODING OF LDPC CODES

CROSS REFERENCE TO RELATED APPLICATIONS

This disclosure claims the benefit under 35 U.S.C. §119 (e) of U.S. Provisional Application No. 61/843,739, filed on Jul. 8, 2013, which is incorporated herein by reference in its entirety.

FIELD OF USE

This disclosure relates generally to data decoding, and more particularly to iterative hybrid message passing and bit flipping decoders for data encoded with a low density parity check (LDPC) encoder.

BACKGROUND

LDPC codes and decoders that are used to decode LDPC codes may be used in numerous applications and devices. For example, data storage, satellite communications, wireless communications, wire-line communications, and power-line communications are applications that may each use LDPC codes and LDPC decoders. Devices such as digital camera flash memory storage, satellites, mobile phones, and other mobile devices may also each use LDPC codes and LDPC decoders.

LDPC codes may be used for correcting errors in information transmitted in a noisy data storage or communications channel. The information may be encoded (by a LDPC encoder) prior to transmission and then subsequently decoded (by a LDPC decoder) when received. LDPC codes are one of the best performing error correction codes, along with Turbo codes, for use in correcting errors in information transmitted on communication and data storage channels.

SUMMARY

In view of the foregoing, systems and methods are provided for iterative data decoding.

According to one aspect of the disclosure, a first message from a variable node is received at a check node. A second message is generated based at least in part on the first message. The second message is transmitted to the variable node. A hard decision value of the variable node is updated based at least in part on the first message and the second message.

In some implementations, the hard decision value is updated based on a previous hard decision value of the variable node. In some embodiments, a third message is generated based at least in part on an initial hard decision value and the updated hard decision value. The third message is transmitted to the check node.

In some embodiments, the second message is based on messages received from a plurality of variable nodes that neighbor the check node. In some implementations, the plurality of variable nodes includes the variable node.

In some implementations, a number of unsatisfied check nodes that neighbor the variable node is calculated based on the first message and a previous hard decision value. A hard decision value is updated based on the number of unsatisfied check nodes.

In some embodiments, a number of unsatisfied check nodes neighboring the variable node is compared to two thresholds. In response to determining that the number of unsatisfied check nodes is greater than a first threshold of the two thresholds, a hard decision value of the variable node is updated by flipping a previous hard decision value if the previous hard decision value is equal to an initial hard decision value. In response to determining that the number of unsatisfied check nodes is greater than a second threshold of the two thresholds, a hard decision value of the variable node is updated by flipping a previous hard decision value if the previous hard decision value is not equal to the initial hard decision value.

According to one aspect of the disclosure, decoding circuitry receives a first message from a variable node at a check node. Decoding circuitry generates a second message based at least in part on the first message. Decoding circuitry transmits the second message to the variable node. Decoding circuitry updates a hard decision value of the variable node based at least in part on the first message and the second message.

In some implementations, decoding circuitry updates the hard decision value based on a previous hard decision value of the variable node. In some embodiments, decoding circuitry generated a third message based at least in part on an initial hard decision value and the updated hard decision value. Decoding circuitry transmits the third message to the check node.

In some embodiments, the second message is based on messages received from a plurality of variable nodes that neighbor the check node. In some implementations, the plurality of variable nodes includes the variable node.

In some implementations, decoding circuitry calculates, based on the first message and a previous hard decision value, a number of unsatisfied check nodes that neighbor the variable node. Decoding circuitry updates a hard decision value based on the number of unsatisfied check nodes.

In some embodiments, decoding circuitry compares a number of unsatisfied check nodes neighboring the variable node to two thresholds. When decoding circuitry determines that the number of unsatisfied check nodes is greater than a first threshold of the two thresholds, decoding circuitry updates a hard decision value of the variable node by flipping a previous hard decision value if the previous hard decision value is equal to an initial hard decision value. When decoding circuitry determines that the number of unsatisfied check nodes is greater than a second threshold of the two thresholds, decoding circuitry updates a hard decision value of the variable node by flipping a previous hard decision value if the previous hard decision value is not equal to the initial hard decision value.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

This disclosure generally relates to performing decoding at a decoder. To provide an overall understanding of the disclosure, certain illustrative embodiments will now be described, including a decoder that decodes a codeword by updating symbol values in multiple iterations. However, it will be understood by one of ordinary skill in the art that the systems and methods described herein may be adapted and modified as is appropriate for the application being addressed, and that the systems and methods described herein may be employed in other suitable applications, and that such other additions and modifications will not depart from the scope thereof.

One of the main characteristics of LDPC codes is that they are associated with a low-density parity check matrix that makes it possible to efficiently decode data using iterative decoders. Generally, iterative decoders can be categorized into two different classes: bit-flipping decoders and message passing decoders. Bit-flipping decoders typically attempt to reduce the number of unsatisfied check nodes by iteratively flipping the values of variable nodes based on the number of unsatisfied check nodes. Message passing decoders, on the other hand, pass messages between variable nodes and check nodes in order to estimate the log-likelihood of variable nodes. While message passing decoders may outperform bit flipping decoders, they generally do so at the cost of higher implementation complexity. In addition, there are certain cases in which message passing decoders may be inferior to bit flipping decoders, e.g., when the channel provides only hard information and/or the message passing decoder is constrained in terms of its complexity. At the same time, the two decoders are complementary in that they are capable of correcting different error profiles. In other words, bit flipping decoders can correct errors that are uncorrectable by message-passing decoders and vice versa. Hence, there is a need for a hybrid decoder that improves data decoding by combining the advantages of bit flipping and message passing, while overcoming their limitations.

Figure 1:
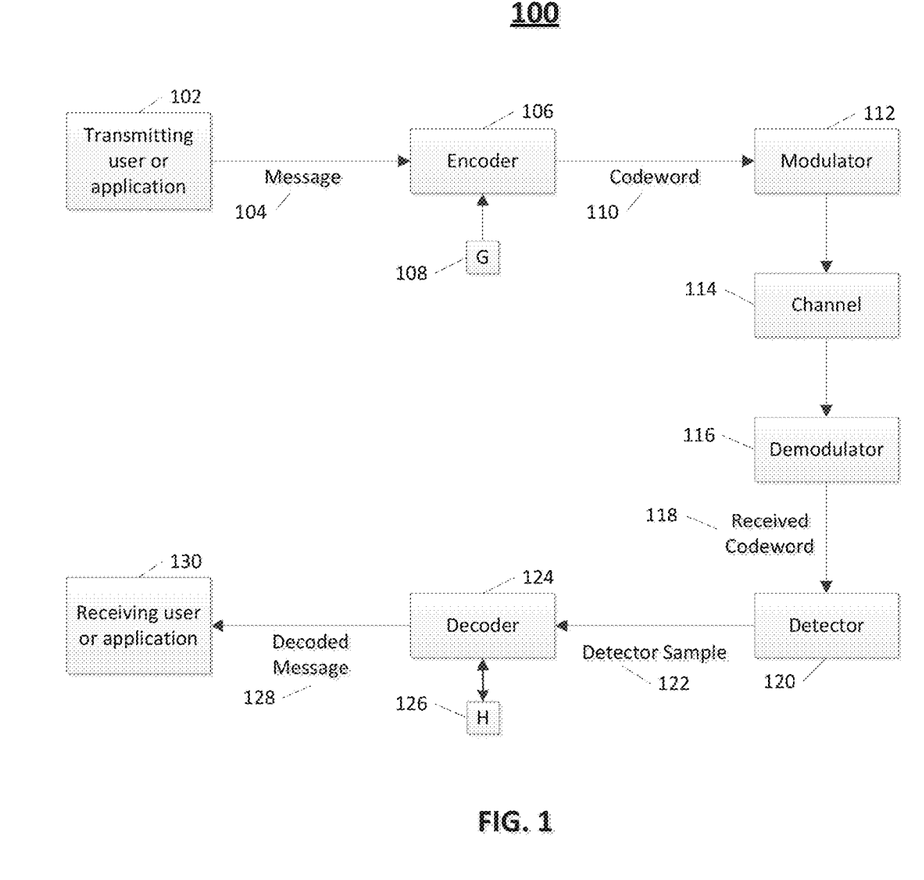
FIG. 1 is a block diagram of an illustrative communications system for hybrid message passing and bit flipping LDPC decoding, in accordance with an embodiment of the present disclosure.

FIG. 1 is a block diagram of an illustrative communications system 100 for hybrid message passing and bit flipping LDPC decoding, in accordance with some embodiments of the present disclosure. A communications system 100 is used to transmit information from a transmitting user or application 102 to a receiving user or application 130. The transmitting user or application 102 represents an object or entity that produces information. For example, the transmitting user or application 102 may correspond to a software program in a computer system or to a component of a wireless communications transmitter in a radio system. The transmitting user or application 102 produces information in the form of a data stream, and the data stream may be represented by a sequence of symbol values that have been pre-processed by, for example, a source encoder (not shown in FIG. 1). The information produced by the transmitting user or application 102 may correspond to voice information, video information, financial information, or any other type of information that may be represented in digital or analog form, and the data stream produced by transmitting user or application 102 may be a digital data stream.

The transmitting user or application 102 may segment or otherwise divide the data stream into blocks of a fixed length of k symbols. In particular, a message 104, also referred to as $\underline{m}$, represents one of these blocks. In particular, the message 104 is k symbols in length, where each symbol may be binary data or non-binary data such as ternary data, quaternary data, any other suitable type of data, or any suitable combination thereof. An encoder 106 is used to encode the message 104 to produce a codeword 110. In one embodiment of the present disclosure, the encoder 106 is an LDPC encoder. However, based on the disclosure and teachings provided herein, it should be clear that the encoder 106 may be any other suitable encoder. The codeword 110, also referred to as $\underline{c}$, has a length of n symbols, where n>k. The encoder 106 uses a generator matrix G 108, also referred to as G for notational convenience, to produce the codeword 110. For example, the encoder 106 may perform one or more matrix operations to convert the message 104 into the codeword 110. In an embodiment, the encoder 106 produces the codeword 110 from the message 104 using the generator matrix G 108 by the following matrix multiplication $$\underline{c} = G\,\underline{m}.$$

The codeword 110 may be modulated or otherwise transformed by a modulator 112 into a waveform suitable for transmission and/or storage on a channel 114. For example, the waveform may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

The channel 114 refers to the physical medium through which the transmitted waveform passes, or is stored on, before being recovered at a demodulator 116. For example, the channel 114 may be a storage channel that represents a storage medium in a computer system environment, or a communications channel that represents the wireless propagation environment in a wireless communications environment. Various characteristics of the channel 114 may corrupt data that is communicated or stored thereon. For example, the channel 114 may be a non-ideal memoryless channel or a channel with memory; the channel 114 may be an erasure channel, and may be symmetric or asymmetric. The output of the channel 114 is demodulated and processed by the demodulator 116 to produce a received codeword 118. The demodulator 116 may use frequency filters, multiplication and integration by periodic functions, and/or any other suitable demodulation technique to demodulate and/or process the output of the channel 114.

The received codeword 118 contains information related to the codeword 110 and may be a corrupted or otherwise altered version of the codeword 110 originally output by the encoder 106. For example, the received codeword 118 may contain a preliminary estimate or noisy version of the codeword 110, a probability distribution vector of possible values of the codeword produced by the encoder 106, or combinations of these as well as other values.

A detector 120 is used to process the received codeword 118 to produce a detector sample 122, which may be an estimate of the original data message 104, also referred to herein as one or more hard decisions. The detector 120 samples each symbol in the received codeword 118 and assigns each symbol to a bin based on the symbol's value. In some embodiments, the bin is assigned based on a probability distribution. Each symbol sampled by the detector 120 may be assigned to one of two or more possible bins, or states. The states that are determined for the detector sample 122 are stored in memory as the sample codeword. This memory is termed the "hard decision memory," which may be in a different memory location from the received codeword 118.

In some embodiments, the channel 114 is read multiple times, and the multiple reads may be processed jointly or separately by the demodulator 116, the detector 120, or both to generate reliability data in addition to the hard decision sample codeword. For example, to determine the input state of a given symbol stored in a flash memory storage device, the memory cell in which the received value of the symbol is stored may be read more than once. Multiple reads of the channel 114 corresponding to the same symbol may be processed by the detector 120 to generate detector sample 122 in the form of reliability data and hard decision data. For example, in a binary code, multiple reads of the channel 114 may be processed by the demodulator 116, the detector 118, or both to generate one bit of hard decision data and one or more bits of reliability data for each bit in the sample codeword. For example, two bits of reliability data may be generated for each bit in the sample codeword. Such reliability data may be stored in a "reliability memory" location that may be separate from the hard decision memory, or may be stored together with the hard decisions in the same memory location. Both hard decision and reliability data in the form of detector sample 122 are transmitted to a decoder 124 as input for subsequent decoding operations.

The decoder 124 receives and iteratively processes the detector sample 122. The detector 120 and the decoder 124 may be two separate processors, or a single processor may be used as both the detector 120 and decoder 124. In general, the decoder 124 includes control circuitry and/or decoding circuitry used to iteratively correct and/or detect errors present in the detector sample 122, for example, due to transmission through the channel 114. In some embodiments, the decoder 124 uses the parity check matrix H 126 and a hybrid message passing and bit flipping LDPC decoding technique to produce a decoded message 128. Validity of the decoded message can be verified using a mathematical vector model $Hc=\vec{0}$, in which c is a binary string of length n corresponding to the decoded message and is the parity check matrix H 126, which is a low-density, sparse m×n matrix, wherein, as above, n is the number of symbols in the codeword, m is the number of check nodes satisfying m≥n−k, and k is the number of symbols in the message. The model is satisfied only when the binary string c is the codeword c 110. The parity check matrix H 126 is not necessarily unique, and may be chosen to be computationally convenient, or to decrease the number of errors generated by the decoding technique of the decoder 124, or both.

In accordance with the present disclosure, the hybrid message passing and bit flipping decoding technique used by the decoder 124 involves processing detector samples 122 by generating and transmitting messages between variable nodes and check nodes and updating hard decision values of variable nodes. In one example, generation of a first message from a variable node to a check node may be performed using a variable node update function, as is described in relation to FIGS. 3, 6 and 7. A second message from a check node to a variable node may be generated using a check node update function, as is described in relation to FIGS. 3 and 4. A hard decision value of a variable node may be updated by using a hard decision update function, as is described in relation to FIGS. 3 and 5. Variable node update function, check node update function, and hard decision update function may be based on any number of input parameters. Examples of input parameters may include messages sent between variable and check nodes in a current iteration, messages sent between variable and check nodes in one or more previous iterations, whether check nodes are satisfied or unsatisfied, whether the number of unsatisfied check nodes is greater than one or more thresholds, whether a hard decision value is equal to an initial hard decision value, whether a hard decision value of a variable node has been previously updated or flipped, the value of the reliability data, or any suitable combination thereof. Generally, as used herein, "flipping" a hard decision value of a variable node refers to updating the hard decision value of the variable node to a different value than the current value. Compared to conventional iterative LDPC decoders, hybrid message passing and bit flipping decoders as discussed herein improve the decoding performance, reduce the total number of decoding iterations required to decode data, or both. Specifically, hybrid message passing and bit flipping decoders incorporate decoding mechanisms of both bit flipping and message passing and may correct a greater variety of errors than conventional bit flipping and message passing decoders having the same implementation complexity.

After processing, each symbol in the decoded message 128 is assigned as one state in a set of possible states. When input into the model $Hc=\vec{0}$ as c, the decoded message 128 satisfies the model. Suitable systems and processes for performing decoding are described in relation to FIGS. 3-8.

The decoded message 128 is delivered to the receiving user or application 130 after being processed by the decoder 124. The receiving user or application 130 may correspond to the same device or entity as the transmitting user or application 102, or the receiving user or application 130 may correspond to a different device or entity. Further, the receiving user or application 130 may be either co-located or physically separated from the transmitting user or application 102. If the decoder 124 corrects all errors that are induced by the channel 114 and other communications effects in the communications system 100, then the decoded message 128 is a logical replica of the message 104. Otherwise, the decoded message 128 may differ from the message 104, and the decoder 124 may declare an error accordingly.

Figure 2A:
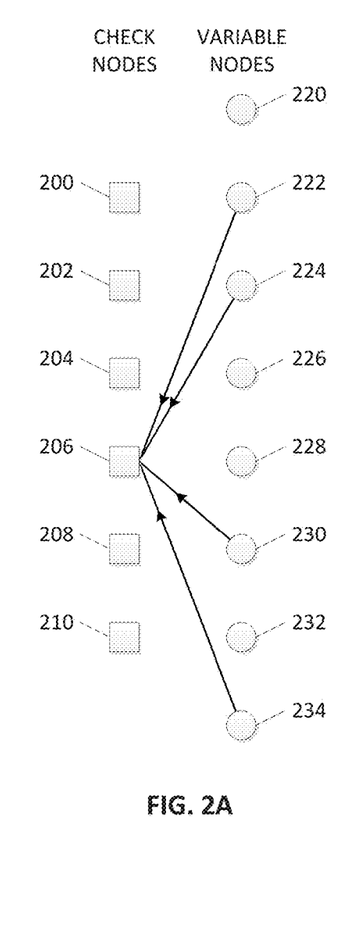
FIGS. 2A and 2B are graphical illustrations of communications between variable nodes representing symbols of a received codeword and check nodes for decoding the received codeword, in accordance with an embodiment of the present disclosure.
Figure 2B:
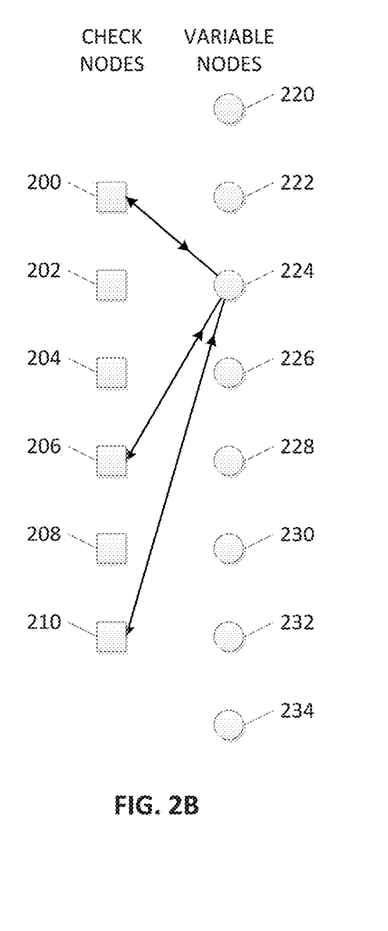

FIGS. 2A and 2B are graphical illustrations of communications between variable nodes 220-234 representing an example codeword and check nodes 200-210 for decoding the codeword using a hybrid message passing and bit flipping decoder, in accordance with an embodiment of the present disclosure.

Upon initialization of the decoding process, variable nodes 220-234 are assigned input states using the detector 120 as described in relation to FIG. 1. In some embodiments, an input state may include one or both of the initial hard decision value and reliability data received from the detector 120.

In one illustrative example, every variable node is associated with a one-bit input state denoted by $[b_0]$, where the value of the bit $b_0$ indicates a hard decision value of the corresponding variable node. In another illustrative example, every variable node is associated with a two-bit input state denoted by $[b_1\ b_0]$, where the value of the bit $b_0$ indicates the hard decision value of a variable node, and the value of the bit $b_1$ indicates the reliability of the hard decision value. In a binary code, $b_0$ may take on values 0 or 1, representing the two possible hard decision states of a decoded bit. Correspondingly, $b_1$ may also take on values 0 or 1, where 0 represents an unreliable hard decision, and 1 represents a reliable hard decision. In other words, an input of 10 to a variable node may be interpreted as a reliable decision of 0, an input of 00 to a variable node may be interpreted as an unreliable decision of 0, an input of 01 to a variable node may be interpreted as an unreliable decision of 1, and an input of 11 to a variable node may be interpreted as a reliable decision of 1. The hard decision and reliability data input may be stored together in one memory location as input states, or separately in a hard decision memory and a reliability memory. As described herein, a one-bit input $[b_0]$ is assumed for simplicity, so that each variable node is associated with a single bit $b_0$ corresponding to a hard decision value, or a hard input received from the channel. However, in general, any number of bits may be used to represent the hard decision value, the reliability, or both. In particular, the hard decision may take on more than two values for non-binary codes, and the reliability messages may carry one or more bits or symbols, resulting in a (k+1)-bit input denoted by $[b_k\ b_{k-1}\ \ldots\ b_1\ b_0]$.

Messages comprising input states of variable nodes 220-234 that are assigned using the detector 120, as described in relation to FIG. 1, are sent to neighboring check nodes. As used herein, a "neighboring" check node of a variable node is a check node that has a connection to the variable node. Similarly, a "neighboring" variable node of a check node is a variable node that has a connection to the check node. Neighboring nodes can be identified using a parity check matrix H. For example, non-zero entries in each row of matrix H may correspond to neighbors of a check node associated with that row. Similarly, non-zero entries in each column of matrix H may correspond to neighbors of a variable node associated with that column. A check of the input states of variable nodes is performed by the decoder 124 on a plurality of groups of variable nodes to determine if the input states correspond to a valid codeword. The decoder 124 uses processing rules to determine a condition of a group of variable nodes. An indication of the determined condition may be stored in syndrome memory at a check node, such as check nodes 200-210. The parity check matrix H 126 (FIG. 1) identifies which check nodes store indications of the determined conditions for which variable nodes. For example, for the nodes pictured in FIGS. 2A and 2B and for a binary code example, the parity check matrix H 126 may be as follows $$H = \begin{bmatrix} 1 & 0 & 1 & 0 & 1 & 1 & 0 & 0 \\ 0 & 1 & 0 & 1 & 0 & 1 & 1 & 0 \\ 1 & 0 & 0 & 1 & 1 & 0 & 1 & 0 \\ 0 & 1 & 1 & 0 & 0 & 1 & 0 & 1 \\ 0 & 1 & 0 & 0 & 1 & 0 & 1 & 1 \\ 1 & 0 & 1 & 1 & 0 & 0 & 0 & 1 \end{bmatrix}$$

Each row corresponds to one of the check nodes, and each column corresponds to one of the variable nodes. With binary codes, the elements of the parity check matrix are 0 or 1, as shown above. The party check matrix H 126 shown above provides indications of the connections between check nodes and variable nodes. Variable nodes and check nodes may be identified by one or more indices. As used herein, index j is used to identify the $j^{th}$ check node $c_j$ in a set of check nodes and index i is used to denote the $i^{th}$ variable node $v_i$ in a set of variable nodes. In particular, as shown in FIG. 2A, variable nodes $v_2$ 222, $v_3$ 224, $v_6$ 230, and $v_8$ 234 are neighbors of check node $c_4$ 206, and as shown in FIG. 2B, check nodes $c_1$ 200, $c_4$ 206, and $c_6$ 210 are neighbors of variable node $v_3$ 224. Furthermore, in binary codes, each check node has one of two states: 0 if the check is satisfied and 1 if the check is not satisfied. For a non-binary code, the elements of the parity check matrix are non-binary, and each check node has one of more than two states. Each row of the parity check matrix forms the coefficients of a parity check equation, which may be computed in the non-binary domain.

In some embodiments, each check node is further associated with one or more bits of check reliability data. For example, if the majority of variable nodes associated with a check node have unreliable variable values, the computed check node value may be flagged as unreliable. The reliability of the check node value may be represented by a corresponding single bit of check reliability data. In some embodiments, more than one bit of check reliability data is stored in a check reliability memory and updated through the decoding process. The check reliability memory may be implemented together with or separately from the syndrome memory and reliability memory used to store reliability data about hard decision values. While check reliability data may improve the performance of the decoder, a system that uses check reliability data has higher implementation complexity, consumes more power than a system that does not use check reliability data, or both. Thus, a trade-off between decoding performance and implementation complexity/power consumption may be considered when determining whether to use check reliability data. The hybrid message passing and bit flipping decoding described herein provides a way to achieve a balance between decoding performance and the implementation complexity or power consumption of the decoder.

The decoder 124 references the parity check matrix H 126 to identify variable nodes associated with a particular check node, or variable nodes that should be checked by the particular check node. For example, for the check node $c_4$ 206, the decoder 124 uses the fourth row of the parity check matrix H 126 to determine that check node $c_4$ 206 performs a check or stores the result of a check of variable nodes $v_2$ 222, $v_3$ 224, $v_6$ 230, and $v_8$ 234 (i.e., the second, third, sixth, and eighth variable nodes). The decoder 124 may reference the parity check matrix H to determine from which variable nodes should the first messages be sent to a particular check node. The decoder 124 may also retrieve hard decision values and associated reliability data either stored in hard decision memory and reliability memory or transmitted as part of first messages from the variable nodes to the check node $c_4$. The values in the fourth row of the parity check matrix H are the coefficients of a parity check equation, which may be each multiplied by the corresponding hard decision values of the variable nodes.

For illustration purposes, the arrows in FIG. 2A indicate that first messages are transmitted from the variable nodes $v_2$ 222, $v_3$ 224, $v_6$ 230, and $v_8$ 234 to the check node $c_4$ 206, and the check node $c_4$ 206 may be considered to "check" the plurality of variable nodes consisting of a variable node $v_2$ 222, $v_3$ 224, $v_6$ 230, and $v_8$ 234. In some embodiments, a first message $m(k,v_i,c_j)$ from an variable node $v_i$ to a $j^{th}$ check node $c_j$ on an iteration k of the decoder may be a function of the current hard decision value $h(k,v_i)$ of the variable node $v_i$ on the iteration k, its initial hard decision value $h(0,v_i)$ corresponding to k=0, and messages from neighbors of $v_i$ to $v_i$, or any combination thereof. As used herein, such a function is also referred to as the "variable node update function," which is discussed in greater detail in relation to FIGS. 3, 6 and 7.

Using hard decision values and reliability data retrieved or sent as part of the first messages from the variable nodes $v_2$ 222, $v_3$ 224, $v_6$ 230, and $v_8$ 234, the decoder 124 determines whether a given condition for the check node $c_j$ is satisfied or not satisfied. An indication of whether the check node $c_j$ is satisfied or not satisfied (i.e., the "syndrome value" or the "check node value" of the check node) may be stored in the syndrome memory, which stores syndrome values or indications of the check nodes. If it is determined that all check nodes have been satisfied, or that a valid codeword has been found, the decoding process may be terminated.

After determining whether conditions for check nodes 200-210 have been satisfied or unsatisfied, second messages may be sent from check nodes to variable nodes. The second messages may include k+1 bits, in which one bit represents the sign of the message and the other k bits represent the magnitude of the message. In some embodiments, the second messages may include syndrome values for check nodes 200-210. In some implementations, the second messages may include check reliability data associated with check nodes 200-210. The parity check matrix H 126 may be used by the decoder 124 to determine from which check nodes the second messages should be sent to a particular variable node. As illustrated in FIG. 2B, for the variable node $v_3$ 224, the parity check matrix H 126 given above indicates that the check nodes $c_1$ 200, $c_4$ 206, and $c_6$ 210 should be referenced. In some embodiments, a second. message $m(k,c_j,v_i)$ from a $j^{th}$ check node $c_j$ to an $i^{th}$ variable node $v_i$ on an iteration k of the decoder may be a function of all or some messages from neighbors of $c_j$ to $c_j$, including a first message from $v_i$ to $c_j$. As used herein, such a function is also referred to as the "check node update function," which is discussed in detail in relation to FIGS. 3 and 4.

In some embodiments of the present disclosure, the hard decision value of an $i^{th}$ variable node $v_i$ may be updated, based on the second messages sent from check nodes, the initial hard decision value $h(0,v_i)$ of the variable node $v_i$, where the first parameter 0 indicates that this is the hard decision value obtained prior to the first iteration k=1 of the decoder, and the first messages sent from the variable node $v_i$ to neighboring check nodes, or any combination thereof. As used herein, such a function to update the hard decision value of the variable node is also referred to as the "hard decision update function," which is discussed in detail in relation to FIGS. 3 and 5.

Multiple iterations of the hybrid message passing and bit flipping decoding may be performed to decode data. As discussed herein, messages sent from check nodes to variable nodes and subsequent messages sent from variable nodes to check nodes may occur in a single iteration. Specifically, for relevant indices i and j, first messages $m(k,v_i,c_j)$ from variable nodes to check nodes may be sent in iteration k of decoding. Second messages $m(k+1,c_j,v_i)$ from check nodes to variable nodes may be transmitted in a subsequent iteration k+1 of decoding. Third messages $m(k+2,v_i,c_j)$ from variable nodes to check nodes may also be transmitted in the iteration k+1, while fourth messages $m(k+2,c_j,v_i)$ from check nodes to variable nodes may be sent in the following iteration k+2, and so on. Hard decision values of variable nodes may be iteratively updated on each iteration k until all check nodes are satisfied (i.e., an all-zero syndrome is achieved) or until a maximum number of iterations k=$k_{max}$ has been reached. The output of the decoder 124 is the content of the hard-decision memory upon termination of the decoding process, or the decoded message 128.

Figure 3:
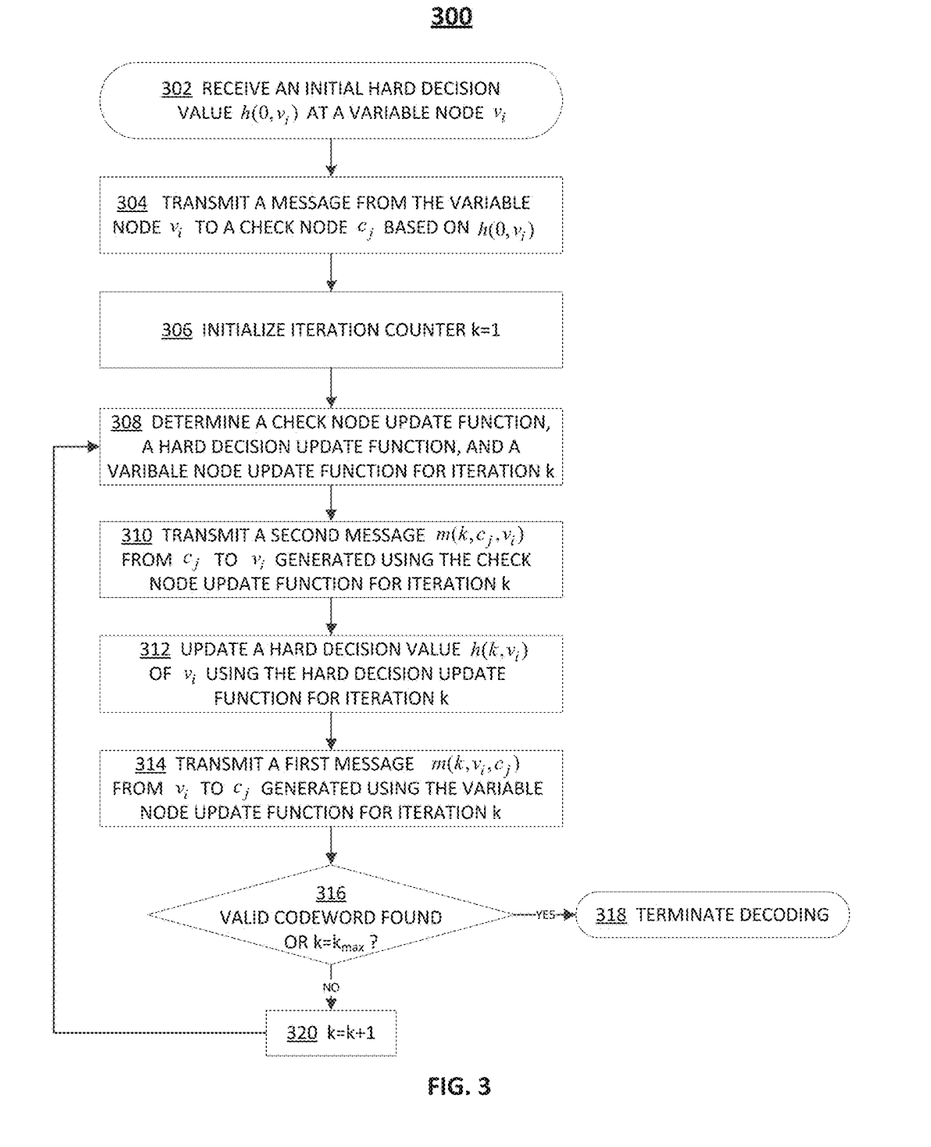
FIG. 3 is a flowchart of an illustrative process for hybrid message passing and bit flipping LDPC decoding, in accordance with an embodiment of the present disclosure.

FIG. 3 is a flowchart of an illustrative process 300 for hybrid message passing and bit flipping LDPC decoding, in accordance with one embodiment of the invention. At 302, the decoder receives an initial hard decision value $h(0,v_i)$ from the detector 120, where the first parameter 0 indicates that this is the hard decision received prior to the first iteration k=1, and the second parameter denotes the $i^{th}$ variable node. At 304, the initial hard decision value $h(0,v_i)$ is transmitted from the variable node $v_i$ to the check node $c_j$. An iteration counter is initialized at 306 to k=1, indicating that a first iteration of the hybrid message passing and bit flipping decoder will start.

At 308, a check node update function, a hard decision update function, and a variable node update function for the k-th iteration are determined. One or more of the functions may be a static function specified prior to the start of the decoding process, or may be a dynamic function, determined at some or all iterations. If all three functions are static, step 308 of the flowchart 300 may require simply retrieving the previously used functions. Alternatively, one or more functions may be static and the remaining one or two functions may change from one iteration k to the next iteration k+1.

Figure 4:
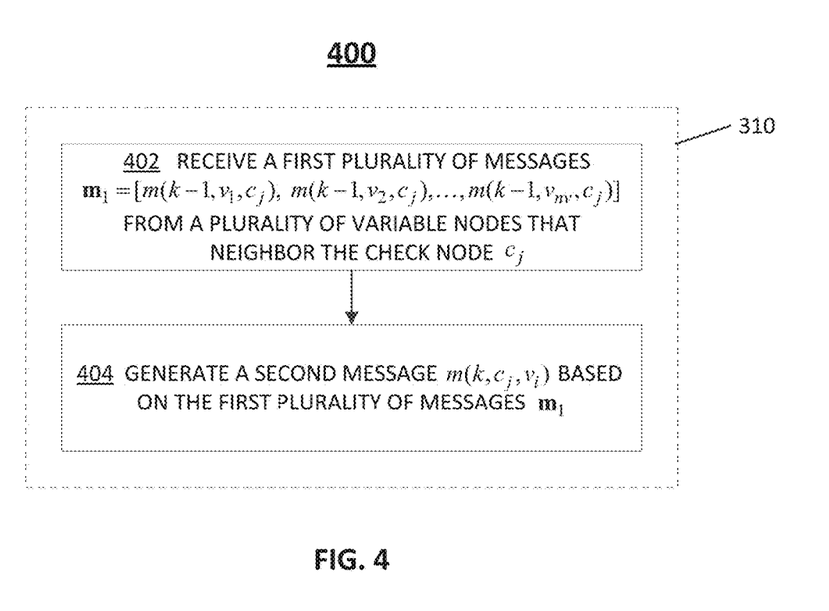
FIG. 4 is a flow chart of an illustrative process for performing a check node update function, in accordance with an embodiment of the present disclosure.

At 310, a second message $m(k,c_j,v_i)$ is transmitted from the check node $c_j$ to the variable node $v_i$, wherein the second message $m(k,c_j,v_i)$ is generated using the check node update function determined for that iteration k, which is discussed in greater detail in relation to FIG. 4. A hard decision value $h(k,v_i)$ of the variable node $v_i$ is updated at 312 using the hard decision update function for iteration k, which is discussed in greater detail in relation to FIG. 5. The hard decision value $h(k,v_i)$ may be equal to the hard decision value $h(k-1,v_i)$ of the variable node on iteration k-1 prior to being updated using the hard decision update function. Furthermore, the hard decision value $h(1,v_i)$ on the first iteration may be equal to the initial hard decision value $h(0,v_i)$, received from the detector 120, prior to being updated using the hard decision update function determined for the first iteration.

Figure 6:
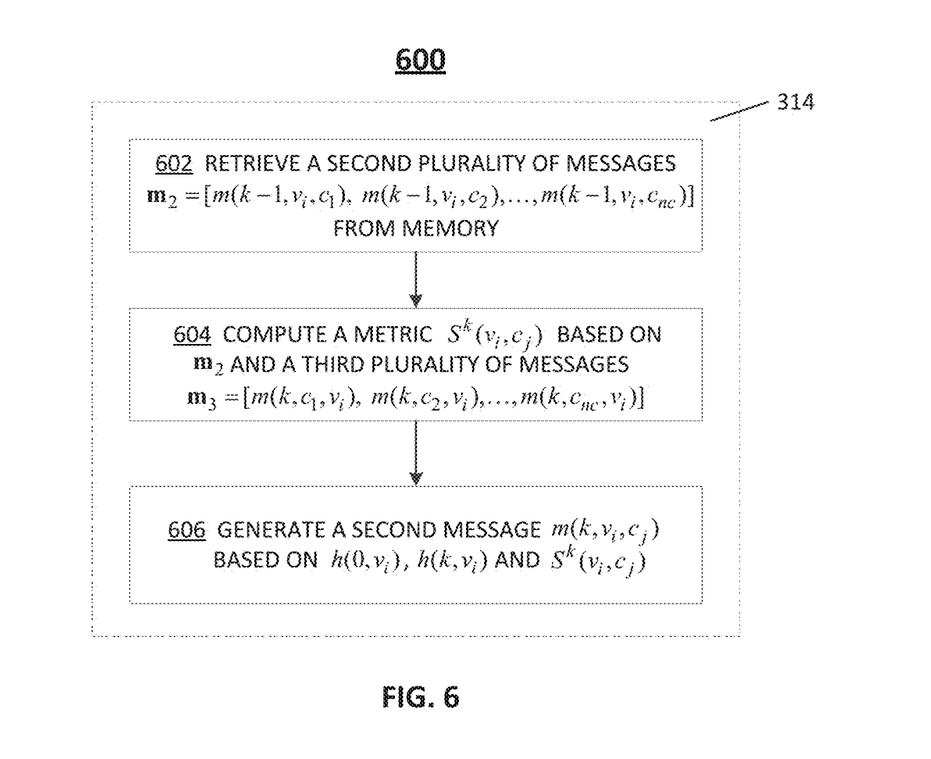
FIG. 6 is a flow chart of an illustrative process for performing a variable node update function, in accordance with an embodiment of the present disclosure.
Figure 7:
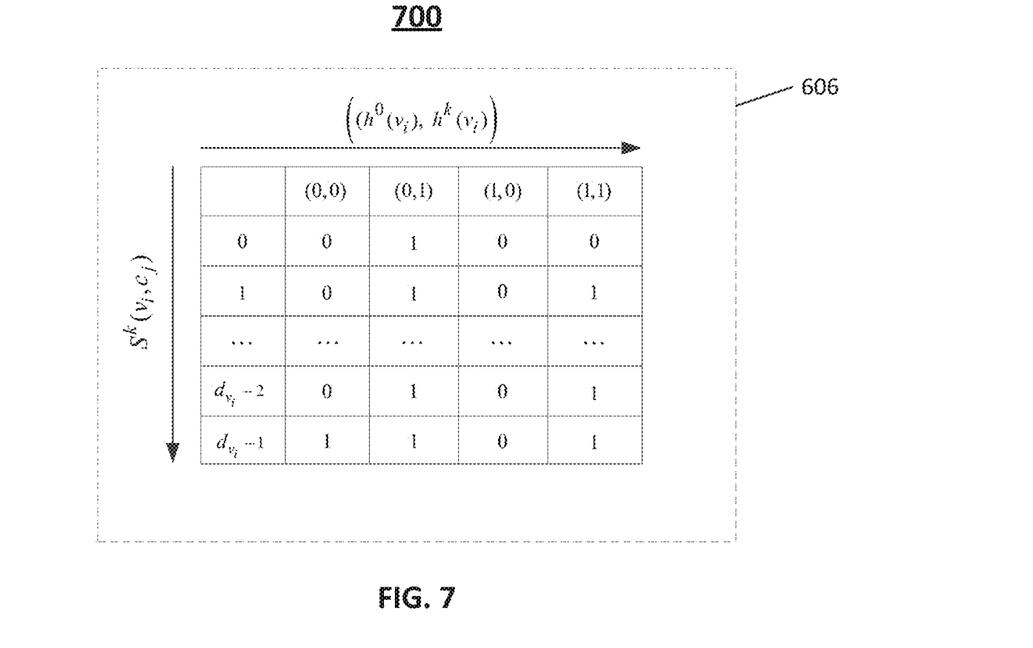
FIG. 7 is a look-up table for generating a first message, in accordance with an embodiment of the present disclosure.

At 314, a first message $m(k,v_i,c_j)$ is generated using the variable node update function, which is discussed in greater detail in relation to FIGS. 6 and 7, and transmitted from the variable node $v_i$ to the check node $c_j$. At 316, the decoder determines whether a valid codeword has been found and/or if the current iteration counter value k is equal to a maximum number of decoding iterations $k_{max}$ at 316. The maximum number of iterations $k_{max}$ may be specified prior to the start of the decoding process or it may be determined during the decoding process. The maximum number of iterations $k_{max}$ may be also updated during the decoding process. For example, decoder 124 may check a syndrome weight or sum of syndrome values associated with check nodes and determine that it is unlikely that a valid codeword is found even if decoding is performed for $k_{max}$ iterations. In some embodiments, decoder 124 may terminate decoding by resetting the value of $k_{max}$. Validation of a decoded codeword may be performed in a similar way as discussed in connection with the mathematical vector model $Hc=\vec{0}$ above, i.e., by looking at the syndrome values associated with the check nodes. If the valid codeword is found, or if the current iteration number k is equal to $k_{max}$, then the decoding is terminated at 318. On the other hand, if $k \leq k_{max}$ and no valid codeword is found, then the iteration counter is incremented at 320, and the decoding process repeats by returning to 308. When all three update functions, namely the check node update function, the hard decision update function, and the variable node update function are static, the decoding process may repeat by returning to 310 instead of 308.

Alternative decoding processes are also possible. For example, both a hard decision value and reliability data associated with the hard decision may be received from the detector 120 by the variable node $v_i$ at 302. Accordingly, a message initially transmitted from to the check node $c_j$ may be further based on the received reliability data. Furthermore, reliability data may be employed in some or all iterations of the hybrid message passing and bit flipping decoder, and in particular by the three update functions. Specific embodiments of the check node update function, the hard decision update function, and the variable node update function, are discussed in relation to FIGS. 4-7.

FIG. 4 is a flow chart of an illustrative process 400 for performing a check node update function, in accordance with an embodiment of the present disclosure. In an example, process 400 may be performed at 310 of FIG. 3. At 402, a first set of messages $m_1=[m(k-1,v_1,c_j), m(k-1,v_2,c_j), \ldots, m(k-1,v_{nv},c_j)]$ is received from a set of variable nodes that neighbor the check node $c_j$. The number of messages in the first set of messages is given by the degree of the check node $c_j$, which refers to the number of variable nodes nv that neighbor, or are connected, to the check node $c_j$. As illustrated in FIG. 4, each message in the first set of messages $m_1$ employed by the check node update function on an iteration k may be a message transmitted from the $i^{th}$ variable node $v_i$ to the $j^{th}$ check node $c_j$ on a previous iteration k−1.

At 404, a second message $m(k,c_j,v_i)$ from the check node $c_j$ to the variable node $v_i$ is generated based on the first set of messages $m_1$. In one illustrative embodiment, the generated second message $m(k,c_j,v_i)$ is given by the exclusive disjunction operation, or exclusive OR (XOR) operation, applied to first messages sent from variable nodes $v_1, v_2, \ldots, v_{nv}$ to the check node $c_j$ on iteration k−1:

$$m(k,c_j,v_i)=m(k-1,v_1,c_j)\oplus m(k-1,v_2,c_j)\oplus \cdots \oplus m(k-1,v_{nv},c_j),$$

where $\oplus$ denotes the XOR operation or the modulo-2 sum in the case of binary-valued messages. The same second message may be sent from the check node $c_j$ to all variable nodes $v_1, v_2, \ldots, v_{nv}$ that neighbor $c_j$.

The check node function discussed above is provided by way of example only. However, it will be understood by one of ordinary skill in the art that the check node update function described herein may be adapted and modified as is appropriate for the application being addressed. For example, the check node update function may depend on the check node reliability value associated with the check node $c_j$. The check node reliability value may be represented by one or more bits of check reliability data. In some embodiments, the check reliability data may be stored in the check reliability memory and updated through the decoding process. In some implementations, a different check node update function may be associated with a corresponding different check node reliability value.

Figure 5:
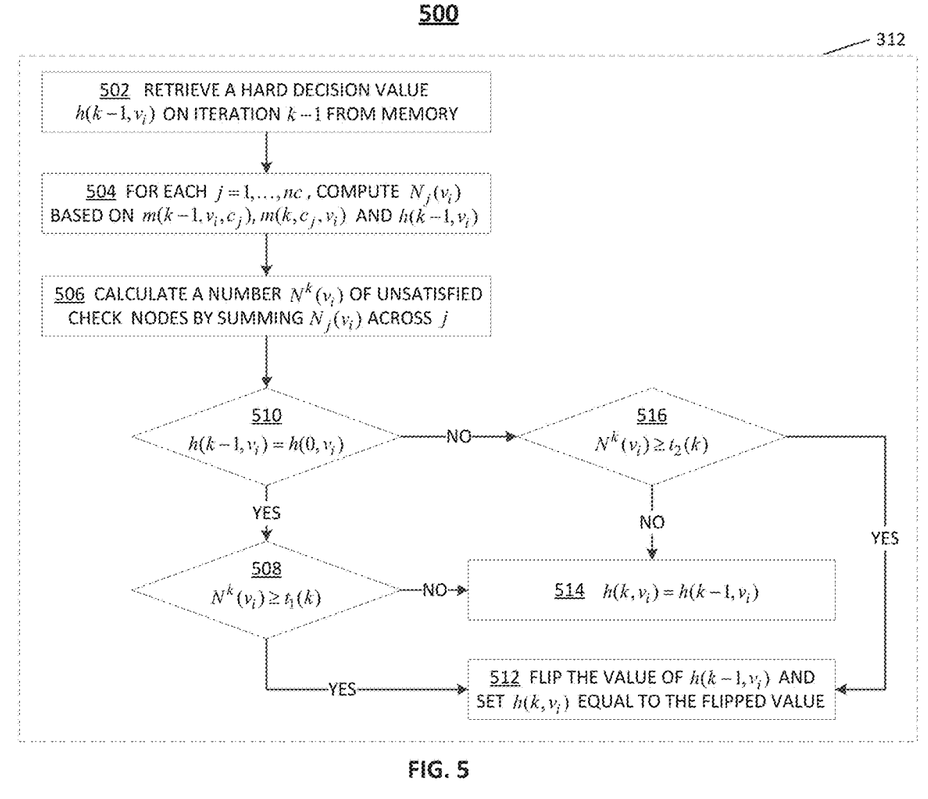
FIG. 5 is a flow chart of an illustrative process for performing a hard decision update function, in accordance with an embodiment of the present disclosure.

FIG. 5 is a flow chart of an illustrative process 500 for performing a hard decision update function, in accordance with an embodiment of the present disclosure. In an example, process 500 may be performed at 312 of FIG. 3. At 502, a hard decision value $h(k-1,v_i)$ of the variable node $v_i$ on iteration k−1 is retrieved from memory. At 504, it is determined whether or not each check node that neighbors the variable node $v_i$ is satisfied. Specifically, a value $N_j(v_i)$ is computed for each j=1, . . . , nc, where nc denotes the degree of the variable node $v_i$, or the number of check nodes neighboring $v_i$. The value $N_j(v_i)$ may be binary, with $N_j(v_i)=0$ indicating that the $j^{th}$ check node is satisfied and $N_j(v_i)=1$ indicating that the $j^{th}$ check node is not satisfied. In one embodiment, $N_j(v_i)$ may be computed based on the first message $m(k-1,v_i,c_j)$ sent from the variable node $v_i$ to the check node $c_j$ on a previous iteration k−1, a second message $m(k,c_j,v_i)$, the retrieved hard decision value $h(k-1,v_i)$, or any suitable combination thereof. For example, $N_j(v_i)$ may be computed by applying an exclusive disjunction operation, or XOR operation, to $m(k-1,v_i,c_j)$, $m(k,c_j,v_i)$ and $h(k-1,v_i)$:

$$N_j(v_i)=m(k-1,v_i,c_j)\oplus m(k,c_j,v_i)\oplus h(k-1,v_i).$$

At 506, a total number $N^k(v_i)$ of unsatisfied check nodes neighboring the variable node $v_i$ is computed by summing $N_j(v_i)$ across j. In particular, $N^k(v_i)$ may be calculated as $$N^k(v_i) = \sum_{j=1}^{nc} N_j(v_i).$$

At 510, the hard decision value $h(k-1,v_i)$ of the variable node $v_i$ is compared to the initial hard decision value $h(0,v_i)$ provided by the detector 120 of FIG. 1. If $h(k-1,v_i)$ is equal to $h(0,v_i)$, then the process proceeds to 508, otherwise the process proceeds to 516.

At 508, the number of unsatisfied check nodes $N^k(v_i)$ is compared to a first threshold $t_1(k)$, where the first threshold $t_1(k)$ may be static (i.e., fixed for some or all iterations), or dynamic (i.e., it may change from one iteration to the next). For example, the first threshold may depend on the number of bit errors. In some embodiments, decoder 124 may use a higher first threshold when the number of bit errors is high and a lower threshold when the number of bit errors is low. In some implementations, a different first threshold may be associated with a different corresponding number of bit errors. If $N^k(v_i)$ is greater than or equal to $t_1(k)$, then the process proceeds to 512, otherwise the process proceeds to 514.

At 516 $N^k(v_i)$ is compared to a second threshold $t_2(k)$. The second threshold $t_2(k)$ may change from one iteration to the next or may be fixed for some or all iterations. For example, the second threshold may depend on the number of bit errors. In some embodiments, decoder 124 may use a higher second threshold when the number of bit errors is high and a lower second threshold when the number of bit errors is low. In some implementations, a different second threshold may be associated with a different corresponding number of bit errors. In some embodiments, the second threshold may be smaller than the first threshold. If $N^k(v_i)$ is greater than or equal to the second threshold $t_2(k)$, then the process proceeds to 512, otherwise the process proceeds to 514.

At 512, the value of $h(k-1,v_i)$ is flipped and the hard decision value $h(k,v_i)$ on iteration k is set to that flipped value. In a binary system, $h(k,v_i)$ may be set equal to $h(k-1,v_i)\oplus 1$, i.e., it may be set equal to the result of the exclusive disjunction operation, or XOR operation, applied to $h(k-1,v_i)$ and a binary digit equal to one.

At 514 the hard decision value $h(k,v_i)$ on iteration k is set equal to the hard decision value $h(k-1,v_i)$ on iteration k-1.

Process 500 discussed above is provided by way of example only. It will be understood by one of ordinary skill in the art that process 500 may be adapted and modified as is appropriate for the application being addressed. Other alternative processes implementing the hard decision update function are also possible. In particular, the number of thresholds may be greater than two. In some embodiments, the number of thresholds may depend on the number of unsatisfied check nodes.

FIG. 6 is a flow chart of an illustrative process 600 for performing a variable node update function, in accordance with an embodiment of the present disclosure. In an example, process 600 may be performed at 314 of FIG. 3. At 602, a second set of messages $m_2$ is retrieved from memory. The number of messages in the second set of messages is the degree of the variable node $v_i$. As discussed herein, the degree of the variable node $v_i$ refers to the number of check nodes nc that neighbor, or are connected, to the variable node $v_i$. The second set of messages $m_2=[m(k-1,v_i,c_1), m(k-1,v_i,c_2), \ldots, m(k-1,v_i,c_{nc})]$ retrieved at iteration k includes messages sent on a previous iteration k-1 from the variable node $v_i$ to each of the nv check nodes $c_1, c_2, \ldots, c_{nc}$ neighboring the variable node $v_i$, including the check node $c_j$.

At 604, a metric $S(k,v_i,c_j)$ is computed based on the second set of messages $m_2$ discussed above and a third set of messages $m_3$. In one embodiment of the present invention, $m_3$ may include second messages sent on the current iteration k to the variable node $v_i$ from neighboring check nodes $c_1, c_2, \ldots, c_{nc}$, including the check node $c_j$, i.e., $m_3=[m(k,c_1,v_i), m(k,c_2,v_i), \ldots, m(k,c_{nc},v_i)]$. In another embodiment, $S(k,v_i,c_j)$ may be computed based on $m_2$ and $m_3$, wherein $m_2$ does not include the message $m(k-1,v_i,c_j)$ from $v_i$ to $c_j$, and $m_3$ does not include the message $m(k,c_j,v_i)$ from $c_j$ to $v_i$. Specifically, for a given i and j, the metric $S(k,v_i,c_j)$ may be computed by applying the exclusive disjunction operation, or XOR operation, to messages $m(k,c_l,v_i)$ and $m(k-1,v_i,c_j)$ for each value of $l=1, 2 \ldots, nc, l \neq j$, and summing the result of the XOR operation across all values of $l=1, 2 \ldots, nc, l \neq j$:

$$S(k, v_i, c_j) = \sum_{l=1, l \neq j}^{nc} m(k, c_l, v_i) \oplus m(k-1, v_i, c_l).$$

At 606, a first message $m(k,v_i,c_j)$ is generated according to a rule based on the metric $S(k,v_i,c_j)$ described above, the initial hard decision value $h(0,v_i)$, the hard decision value $h(k,v_i)$ on the current iteration k, or any suitable combination thereof. One example method for generating the first message in 606 is described below in relation to FIG. 7.

FIG. 7 is a look-up table 700 for generating a first message. In an example, the look-up table 700 may be used at 606. In one illustrative embodiment, the first message $m(k,v_i,c_j)$ may be generated using either a static look-up table (i.e., fixed for some or all iterations), or a dynamic look-up table (i.e., one that changes from one iteration to the next) that is similar to the look-up table 700. Entries appearing in the top row of the table correspond to four possible combinations of a pair of binary hard decision values ($h(0,v_i), h(k,v_i)$), where $h(0,v_i)$ is the initial hard decision value and $h(k,v_i)$ is the hard decision value on the current iteration k. For non-binary hard-decision values, the top row of the table 700 may include more than four combinations of hard decision values. Entries appearing in the first column of the table are associated with the metric $S(k,v_i,c_j)$ discussed in relation to FIG. 6. In one embodiment, $S(k,v_i,c_j)$ may take on nc different values, where nc is the degree of the variable node $v_i$. The table entries corresponding to each value of $S(k,v_i,c_j)$ and each combination of the pair ($h(0,v_i), h(k,v_i)$) specify the first message that is generated in 606 of the flowchart of FIG. 6. Although only single bit messages are shown for illustration purposes, the first messages may not be binary or may include more than one bit, as discussed above in connection with FIG. 1. In some embodiments, the table entries may be generated by an optimization process, e.g., by a convex optimization process.

Figure 8:
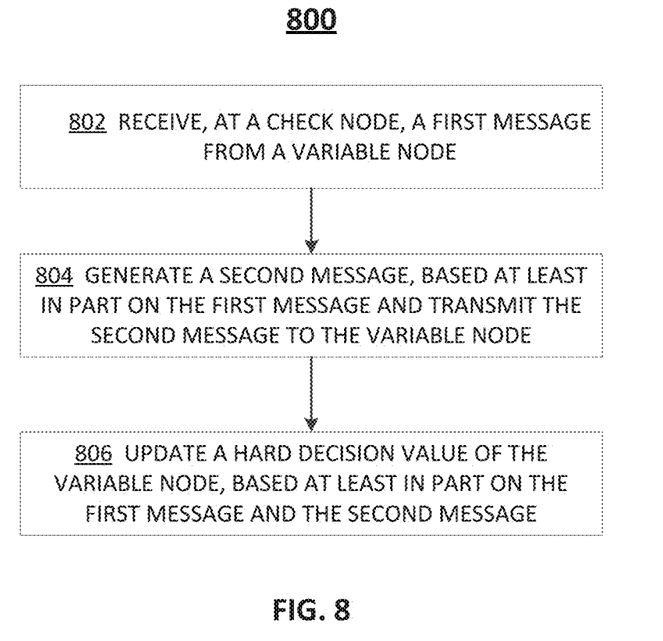
FIG. 8 is a flow chart of an illustrative process for hybrid message passing and bit flipping decoding, in accordance with an embodiment of the present disclosure.

FIG. 8 is a flow chart of an illustrative process 800 for hybrid message passing and bit flipping decoding, in accordance with an embodiment of the present disclosure. A decoder may execute the process 800 by receiving a first message at a check node from a variable node. In some embodiments, decoding circuitry may be configured to generate the first message using a static or a dynamic variable node update function, as discussed in detail in relation to FIG. 6. Furthermore, the variable node update function may include a look-up table that may be either static (i.e., fixed for some or all iterations), or dynamic (i.e., one that changes from one iteration to the next), as discussed in detail in relation to FIG. 7. In some embodiments, the decoding circuitry may also transmit the first message or retrieve the first message from memory, as discussed in relation to FIG. 3.

At 804, the decoding circuitry generates a second message, based at least in part on the first message, and subsequently transmits the second message to the variable node. In some embodiments, the second message may be generated using a check-node update function discussed in relation to FIGS. 3 and 4. The decoding circuitry may implement the check-node update function using an exclusive disjunction operation, or XOR operation, e.g., by applying XOR to first messages received at a check node on a previous iteration from variable nodes that neighbor that check node.

At 806, the decoding circuitry updates the hard decision value of the variable node, based at least in part on the first message and the second message. In some embodiments, the hard decision value of the variable node may be updated using a hard decision update function discussed in relation to FIG. 5. In one illustrative embodiment, the decoding circuitry calculates a number of unsatisfied check nodes based at least in part of the first message and the second message. The decoding circuitry may be further configured to compare the number of unsatisfied check nodes to two thresholds. In some embodiments, updating the hard decision value of the variable node includes comparing the hard decision value on a previous decoding iteration to the hard decision value on the current decoding iteration and flipping the value of the bit corresponding to the hard decision value on the previous iteration.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:

1. A method for iterative data decoding, comprising:
receiving, at a check node, a first message from a variable node;
generating, by decoding circuitry, a second message, based at least in part on the first message, and transmitting the second message to the variable node;
updating, by the decoding circuitry, a hard decision value of the variable node, based at least in part on a comparison between the first message and the second message, wherein the first message is generated in a first iteration of the iterative data decoding and a third message is generated differently from the first message in a second iteration of the iterative data decoding based at least in part on the updated hard decision value; and
transmitting the third message to the check node.

2. The method of claim 1, wherein updating a hard decision value of the variable node is based on a previous hard decision value of the variable node.

3. The method of claim 1, the method further comprising:
generating the third message, based at least in part on an initial hard decision value and the updated hard decision value.

4. The method of claim 3, wherein the first message is generated in a first iteration of the iterative decoding and the second and third messages are generated in a second iteration of the iterative data decoding, the method further comprising:
generating a fourth message in a third iteration of the iterative data decoding, based at least in part on the third message; and
transmitting the fourth message to the variable node, wherein the fourth message is generated differently than the second message.

5. The method of claim 3, wherein generating the third message is further based on the second message.

6. The method of claim 1, wherein the second message is based on messages received from a plurality of variable nodes that neighbor the check node.

7. The method of claim 1, further comprising:
calculating a number of unsatisfied check nodes that neighbor the variable node, based on the first message and a previous hard decision value; and
wherein updating a hard decision value of the variable node comprises updating a hard decision value, based on the number of unsatisfied check nodes.

8. The method of claim 1, further comprising:
comparing a number of unsatisfied check nodes neighboring the variable node to two thresholds;
determining, based on the comparing, that the number of unsatisfied check nodes is greater than a first threshold of the two thresholds, and wherein updating a hard decision value of the variable node comprises updating a hard decision value of the variable node by flipping a previous hard decision value if the previous hard decision value is equal to an initial hard decision value; and determining, based on the comparing, that the number of unsatisfied check nodes is greater than a second threshold of the two thresholds, and wherein updating a hard decision value of the variable node comprises updating a hard decision value of the variable node by flipping a previous hard decision value if the previous hard decision value is not equal to the initial hard decision value.

9. An iterative decoder comprising decoding circuitry configured to:
receive, at a check node, a first message from a variable node;
generate a second message, based at least in part on the first message and transmit the second message to the variable node;
update a hard decision value of the variable node, based at least in part on a comparison between the first message and the second message, wherein the first message is generated in a first iteration of the iterative data decoding and a third message is generated differently from the first message in a second iteration of the iterative data decoding based at least in part on the updated hard decision value; and
transmit the third message to the check node.

10. The system of claim 9, wherein the decoding circuitry is configured to update a hard decision value of the variable node based on a previous hard decision value of the variable node.

11. The system of claim 9, wherein the decoding circuitry is further configured to:
generate the third message, based at least in part on an initial hard decision value and the updated hard decision value.

12. The system of claim 11, wherein the first message is generated in a first iteration of the iterative decoding and the second and third messages are generated in a second iteration of the iterative data decoding, wherein the decoding circuitry is further configured to:
generate a fourth message in a third iteration of the iterative data decoding, based at least in part on the third message; and
transmit the fourth message to the variable node, wherein the fourth message is generated differently than the second message.

13. The system of claim 11, wherein the decoding circuitry is configured to generate the third message based on the second message.

14. The system of claim 9, wherein the second message is based on messages received from a plurality of variable nodes that neighbor the check node.

15. The system of claim 9, wherein the decoding circuitry is further configured to:
calculate a number of unsatisfied check nodes that neighbor the variable node, based on the first message and a previous hard decision value; and
wherein the decoding circuitry configured to update a hard decision value of the variable node comprises decoding circuitry configured to update a hard decision value of the variable node, based on the number of unsatisfied check nodes.

16. The system of claim 9, wherein the decoding circuitry is further configured to:
compare a number of unsatisfied check nodes neighboring the variable node to two thresholds;
determine, based on the comparing, that the number of unsatisfied check nodes is greater than a first threshold of the two thresholds, and wherein updating a hard decision value of the variable node comprises updating a hard decision value of the variable node by flipping a previous hard decision value if the previous hard decision value is equal to an initial hard decision value; and determine, based on the comparing, that the number of unsatisfied check nodes is greater than a second threshold of the two thresholds, and wherein updating a hard decision value of the variable node comprises updating a hard decision value of the variable nod by flipping a previous hard decision value if the previous hard decision value is not equal to the initial hard decision value.

* * * * *